United States Patent
Suzuki et al.

(10) Patent No.: US 7,078,797 B2
(45) Date of Patent: Jul. 18, 2006

(54) HYBRID INTEGRATED CIRCUIT DEVICE

(75) Inventors: Takeshi Suzuki, Gunma (JP);
Kazushige Osumi, Gunma (JP);
Junichi Ichihashi, Gunma (JP);
Toshiyuki Iimura, Saitama (JP);
Shinichi Tsuyuki, Gunma (JP)

(73) Assignee: Sanyo Electric Co., Ltd.

( * ) Notice: Subject to any disclaimer, the term of this patent is extended or adjusted under 35 U.S.C. 154(b) by 118 days.

(21) Appl. No.: 10/813,137

(22) Filed: Mar. 29, 2004

(65) Prior Publication Data

US 2004/0251533 A1    Dec. 16, 2004

(30) Foreign Application Priority Data

Jun. 11, 2003    (JP)    ..................... P. 2003-166486

(51) Int. Cl.
*H01L 23/48*    (2006.01)

(52) U.S. Cl. ................. 257/690; 257/701; 257/E23.003

(58) Field of Classification Search ................ 257/690, 257/701

See application file for complete search history.

(56) References Cited

U.S. PATENT DOCUMENTS

| 5,321,299 A | * | 6/1994 | Ohkawa et al. | ............. 257/528 |
| 6,351,026 B1 | * | 2/2002 | Hirasawa et al. | ........... 257/678 |
| 6,373,705 B1 | * | 4/2002 | Koelle et al. | ............... 361/720 |

* cited by examiner

*Primary Examiner*—Roy Potter
(74) *Attorney, Agent, or Firm*—Fish & Richardson P.C.

(57) ABSTRACT

Provided is a hybrid integrated circuit device which can more effectively stabilize a circuit configured to operate at a high speed. A hybrid integrated circuit device of the embodiment includes a metal substrate provided with an insulating layer on a surface thereof, a conductive pattern formed on a surface of the insulating layer, a semiconductor element fixed onto the conductive pattern, a lead as external connecting means fixed to the conductive pattern in the periphery of the metal substrate, and a contact portion for electrically connecting the conductive pattern electrically connected to the semiconductor element to the metal substrate in the vicinity of the semiconductor element.

8 Claims, 6 Drawing Sheets

HYBRID INTEGRATED CIRCUIT DEVICE

BACKGROUND OF THE INVENTION

1. Field of the Invention

The present invention relates to a hybrid integrated circuit device, more specifically, to a hybrid integrated circuit device having a semiconductor element which operates at a high frequency.

2. Description of the Related Art

A configuration of a conventional hybrid integrated circuit device 100 will be described with reference to FIGS. 6A and 6B. FIG. 6A is a plan view of the conventional hybrid integrated circuit device 100 and FIG. 6B is a cross-sectional view thereof.

Referring to FIG. 6A, a conductive pattern 102 is formed on a surface of a metal substrate 101, which is made of metal such as aluminum, through an insulating layer 107. A desired hybrid integrated circuit is realized by mounting a circuit element 105 in a predetermined position of the conductive pattern 102. Here, an integrated circuit chip (IC), a chip resistor, a chip capacitor, a power transistor or the like is adopted as the circuit element 105, and a transistor which is mounted face up is electrically connected to the conductive pattern 102 through a fine metal wire 103. A plurality of pads 102A made of the conductive pattern 102 are formed on one side edge of the metal substrate 101, and leads 104 are fixed to these positions with a brazing material such as solder. One of applications of the hybrid integrated circuit device 100 configured as described above includes an audio amplifier module, for example.

In addition, to avoid occurrence of parasitic capacitance between the metal substrate 101 and the conductive pattern 102, a lead 104A connected to ground potential is electrically connected to the metal substrate 101 through the conductive pattern 102 and a contact portion 108. Moreover, the hybrid integrated circuit device 100 having the above-described configuration is sealed with a casing material or sealing resin.

However, the above-described hybrid integrated circuit device has the following problems.

Specifically, when a D-class amplifier circuit configured to operate at high speed is formed on the surface of the metal substrate 101, electric potential of the metal substrate 101 is changed by a capacitance which is generated between the conductive pattern 102 and the metal substrate 101. Such a change in electric potential adversely affects electric signals which pass through other parts of the conductive pattern 102, and resultantly causes noises in an audio output.

Moreover, an inductance component is generated in the lead 104A which is connected to the metal substrate 101. Such an inductance component destabilizes operations of the entire device. On the other hand, if the metal substrate 101 is set electrically independent in order to avoid this problem, it is not possible to suppress unnecessary radiation.

SUMMARY OF THE INVENTION

The embodiment of the present invention has been made in consideration of the foregoing problems. Therefore, a principal object of the embodiment of the present invention is to provide a hybrid integrated circuit device which can more effectively stabilize a circuit configured to operate at a high speed.

A hybrid integrated circuit device of the present invention includes a metal substrate provided with an insulating layer on a surface thereof, a conductive pattern formed on a surface of the insulating layer, a semiconductor element fixed onto the conductive pattern, and a contact portion for electrically connecting the conductive pattern to the metal substrate in the vicinity of the semiconductor element.

Moreover, another hybrid integrated circuit device of the present invention includes a metal substrate provided with an insulating layer on a surface thereof, a conductive pattern formed on a surface of the insulating layer, a semiconductor element being fixed onto the conductive pattern and constituting a bridge circuit, and a contact portion for electrically connecting the metal substrate in the vicinity of the semiconductor element to the conductive pattern connected to ground potential.

DESCRIPTION OF THE PREFERRED EMBODIMENT

Figure 1A:
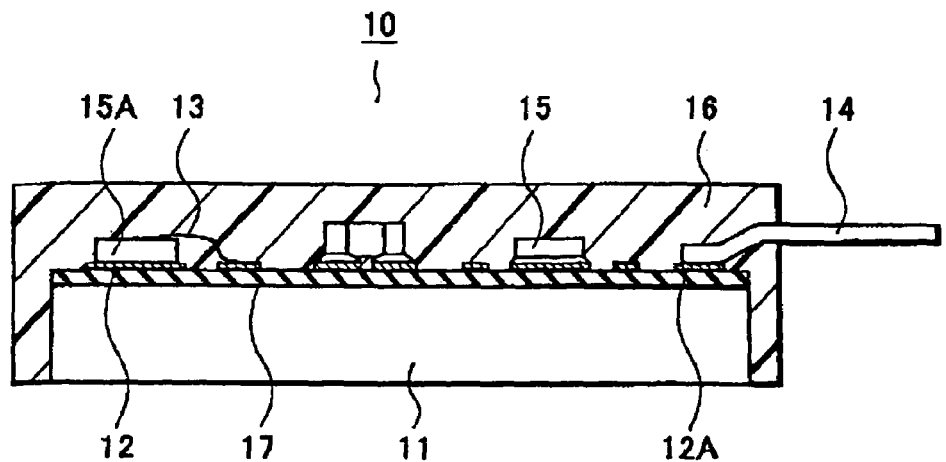
FIG. 1A is a cross-sectional view of a hybrid integrated circuit device of the present embodiment.
Figure 1B:
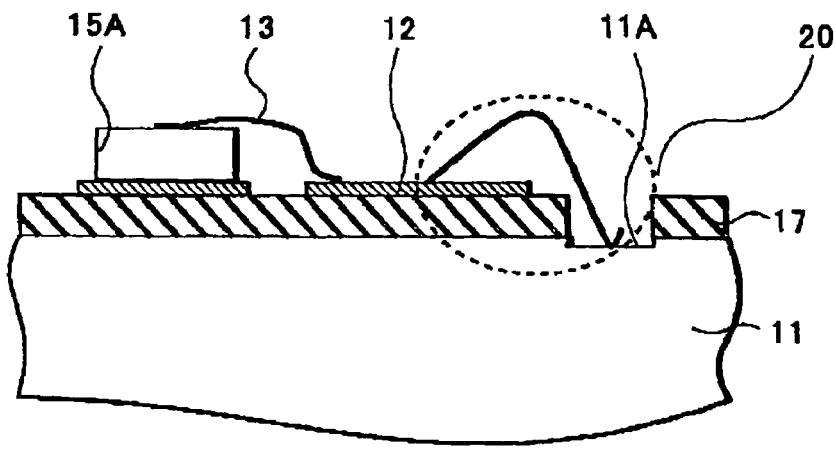
FIG. 1B is another cross-sectional view thereof.
Figure 1C:
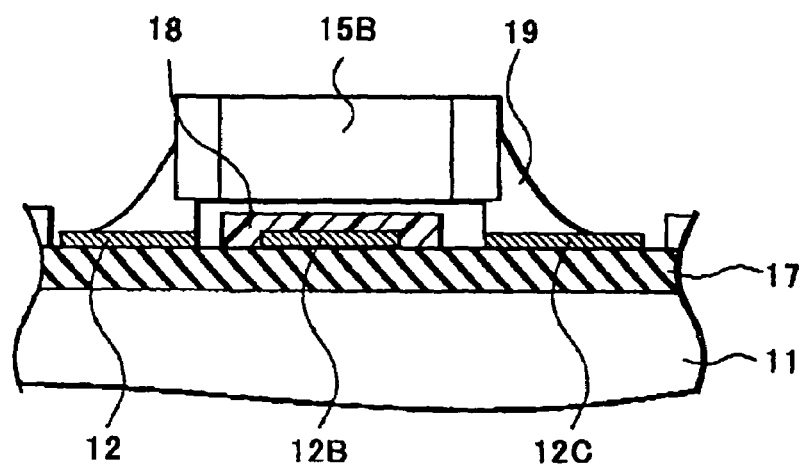
FIG. 1C is still another cross-sectional view thereof.

A configuration of a hybrid integrated circuit device 10 will be described with reference to FIGS. 1A to 1C. FIGS. 1A to 1C are cross-sectional views of the hybrid integrated circuit device 10.

The hybrid integrated circuit device 10 of the present embodiment includes a metal substrate 11 provided with an insulating layer 17 on a surface thereof, a conductive pattern 12 formed on a surface of the insulating layer 17, a semiconductor element 15A fixed onto the conductive pattern 12, a lead 14 as external connecting means fixed to the conductive pattern 12 in the periphery of the metal substrate 11, and a contact portion 20 for electrically connecting the conductive pattern 12 to the metal substrate 11 in the vicinity of the semiconductor element 15A. These constituents will now be described below.

Metal such as aluminum or copper is adopted as a material for the metal substrate 11. It is also possible to adopt a metal alloy as the material for the metal substrate 11. The metal substrate 11 made of aluminum is employed herein and both surfaces thereof are subjected to alumite treatment, for example. The insulating layer 17 is formed on the surface of the metal substrate 11, and has a function to insulate the conductive pattern 12 from the metal substrate 11. Alternatively, alumina may be filled at high density in the insulating layer 17 in order to transfer the heat generated by a circuit element 15 actively to the metal substrate 11. Here, it is not always necessary to provide an oxide such as $Al_2O_3$ on the surface of the aluminum substrate for the purpose of insulation or the like. Therefore, the surface of the metal substrate may be subjected to other insulation treatment.

The conductive pattern 12 is provided on the surface of the insulating layer 17 and is made of metal such as copper. The circuit element 15 is fixed to a predetermined position of the conductive pattern 12, and a plurality of pads 12A made of the conductive pattern 12 are disposed on a side edge of the metal substrate 11. A predetermined electric circuit is formed on the metal substrate 11 by means of fixing the circuit element 15 to the predetermined position of the conductive pattern 12. For example, a plurality of bridge circuits may be formed on the surface of the metal substrate 11. Moreover, the conductive pattern 12 may be covered with a resin coating except for positions for electric connection.

The circuit element 15 is mounted on the predetermined position of the conductive pattern 12 with a brazing material such as solder. As the circuit element 15, a passive element, an active element, a circuit device, or the like is generally applicable. When mounting an element for a power system, it is possible to mount such an element on a heat sink fixed onto the conductive pattern. A transistor or an IC to be mounted face up thereon is electrically connected to the conductive pattern 12 through a fine metal wire 13. Alternatively, a resin-packaged IC may be fixed as the circuit element 15 to the conductive pattern 12.

The lead 14 is fixed to the pad 12A made of the conductive pattern 12 through the brazing material such as solder, and has a function for performing electrical input and output to and from outside. Here, the lead 14 is fixed to one side edge of the metal substrate 11. However, it is also possible to provide the leads 14 on both opposite edges of the metal substrate 11.

The semiconductor element 15A is, for example, a metal oxide semiconductor field effect transistor (MOSFET). More preferably, it is possible to adopt a power MOSFET which switches at amplitude equal to or greater than 50 V, or a semiconductor element which operates at low amplitude and at high speed. Here, it is possible to adopt an element constituting a bridge circuit as the semiconductor element 15A.

Sealing resin 16 covers the conductive pattern 12 formed on the surface of the metal substrate 11 as well as the circuit element 15. Moreover, the sealing resin 16 herein covers the entire metal substrate 11 while exposing the rear surface of the metal substrate 11. In this way, it is possible to actively radiate the heat generated by the operation of the circuit element 15 by means of exposing the rear surface of the metal substrate 11. Alternatively, it is possible to form the sealing resin 16 so as to cover the rear surface of the metal substrate 11 as well. In this case, it is possible to improve moisture resistance of the entire device.

The contact portion 20 for connecting the conductive pattern 12 to the metal substrate 11 will be described in detail with reference to FIG. 1B. Of the conductive pattern 12 shown in the drawing, one end is connected to a source electrode of the semiconductor element 15A through the fine metal wire 13, and the other end is connected to the ground potential through the lead 14. Then, the surface of the metal substrate 11 is exposed by means of partially removing the insulating layer 17, and thereby constituting an exposure 11A. The exposure 11A is connected to the conductive pattern 12 by the fine metal wire 13. Therefore, the metal substrate 11 in the vicinity of the semiconductor element 15A is connected to the ground potential by way of the fine metal wire 13, the conductive pattern 12, and the lead 14.

Referring to FIG. 1C, a conductive pattern 12 electrically connected to the metal substrate 11 is electrically connected to a capacitor 15B in the vicinity of the semiconductor element 15A. Here, the conductive pattern 12 is connected to the ground potential, a conductive pattern 12B allows an output signal to pass through, and a conductive pattern 12C is connected to a power source. The capacitor 15B has a relatively large capacitance and is fixed by a brazing material 19 so as to short-circuit the conductive patterns 12A and 12C. Moreover, the conductive pattern 12B is formed to be drawn below the capacitor 15B. Meanwhile, a surface of the conductive pattern 12B is covered with coating resin 18. Therefore, the conductive pattern 12B is prevented from short circuiting with the capacitor 15B or the brazing material 19. In this way, it is possible to improve wiring density of the metal substrate 11 by forming the conductive pattern 12B below the capacitor 15B which is the relatively large element.

An advantage of the embodiment exists in that the conductive pattern 12 connected to the ground potential is electrically connected to the metal substrate 11 in the vicinity of the semiconductor element 15A which operates at high speed, and that the capacitor 15B is further connected thereto. To be more precise, electric potential of the metal substrate 11 in the vicinity of the semiconductor element 15A is changed by high-speed switching of the semiconductor element 15A. Accordingly, in the present embodiment, the electric potential is absorbed by the capacitor 15B by connecting the metal substrate 11 in the vicinity of the semiconductor element 15A to the capacitor 15B through the contact portion 20. Therefore, it is possible to suppress a significant change in electric potential of the metal substrate 11 in the vicinity of the semiconductor element 15A. Meanwhile, when a plurality of semiconductor elements 15A are provided, it is possible to adjust the number of the contact portions 20 in response to the number of the semiconductor elements 15A.

Figure 2:
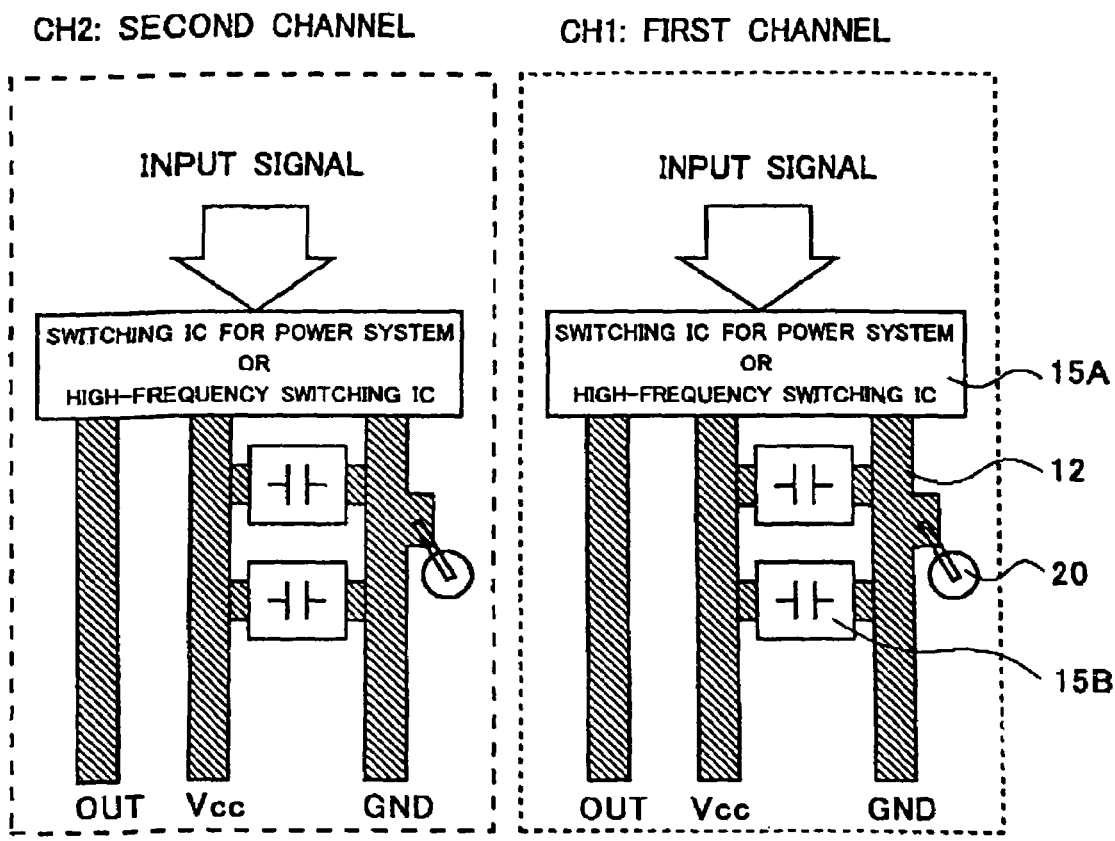
FIG. 2 is a plan view of the hybrid integrated circuit device of the present embodiment.

A planar configuration of the concrete hybrid integrated circuit device 10 will be described with reference to FIG. 2. A plurality of channels are formed on the surface of the metal substrate 11, and each of the channels constitutes a half-bridge circuit. The drawing shows two bridge circuits comprised of first and second channels CH1 and CH2. However, it is possible to form the channels comprised of an arbitrary plurality of half bridges on the surface of the metal substrate 11.

The first channel CH1 includes the semiconductor element 15A which operates in response to an input signal. A switching element for a power system, a high-frequency switching element, or the like can be adopted as this semiconductor element 15A. The semiconductor element 15A is connected to the conductive pattern 12. Here, three portions of the conductive pattern 12 are connected to a power source Vcc, ground potential GND, and output potential OUT, respectively. The contact portion 20 electrically connects the conductive pattern 12 connected to GND to the metal substrate 11 in the vicinity of the semiconductor element 15A. The capacitors 15B are fixed so as to short-circuit the portion of the conductive pattern 12 connected to Vcc and the portion of the conductive pattern 12 connected to the GND. Although two capacitors 15B are fixed herein, the number of the capacitors 15 can be arbitrarily changed.

The second channel CH2 is disposed closely to the above-described first channel CH1, and has a similar configuration to the first channel CH1.

Now, circuits to be arranged in the hybrid integrated circuit device 10 will be described with reference to FIG. 3. Here, the hybrid integrated circuit device 10 includes four channels, namely, a first channel CH1, a second channel CH2, a third channel CH3, and a fourth channel CH4. Each of the channels constitutes a half-bridge circuit.

Describing the first channel CH1 in detail, reference numerals TR1 and TR2 are switching elements which constitute a bridge circuit. It is possible to adopt MOSFETs for a power system as the switching elements, for example. Gate electrodes of the TR1 and TR2 are connected to a first integrated circuit IC1, and the TR1 and TR2 perform switching in response to electric signals from the IC1. A drain electrode D1 of the TR1 is connected to a first power source Vcc1. Meanwhile, a source electrode S1 of the TR1 is connected to a drain electrode D2 of the TR2, and a first output OUT1 is drawn out of an intermediate position between the both electrodes. A source electrode S2 of the TR2 is connected to first ground potential GND1 and is connected to a first contact portion point SUB1 of the metal substrate 11 in the vicinity of the TR1 and TR2. That is to say, the contact portion point SUB1 is formed by a structure similar to the contact portion 20 shown in FIG. 1B.

First capacitors C1 which are coupling capacitors are provided so as to short-circuit the first ground potential GND1 and the first power source Vcc1. Moreover, the two first capacitors C1 are provided in parallel in the vicinity of the first contact portion point SUB 1. Accordingly, if the TR1 and TR2 operate at high speed and thereby increase the electric potential of the metal substrate 11 in the vicinity thereof, the electric potential immediately flows into the first capacitors C1. Therefore, it is possible to suppress the electric potential to adversely affect other positions of electric circuits.

Figure 4A:
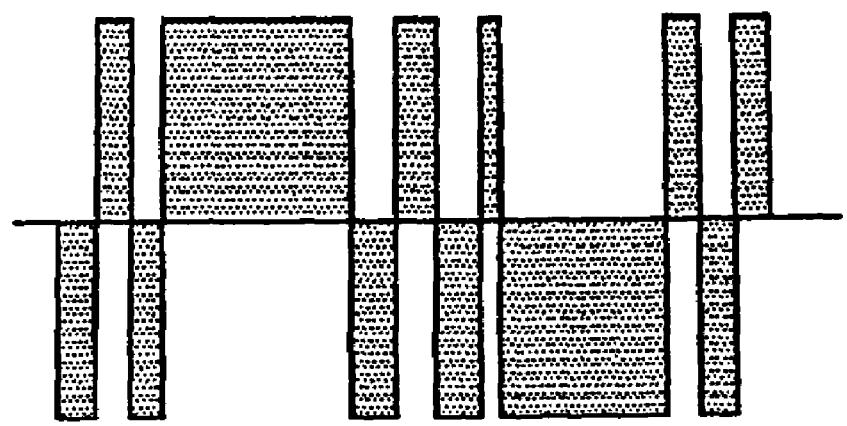
FIGS. 4A and 4B are graphs showing characteristics of the hybrid integrated circuit device of the present embodiment.
Figure 4B:
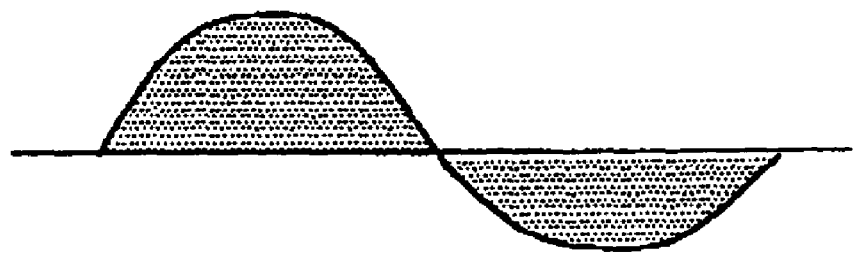

The second channel CH2 has a similar configuration to the above-described first channel CH1, and an output signal is outputted from a second output OUT2. Moreover, the first and second channels CH1 and CH2 collectively constitute an H-bridge circuit. Specifically, the first and second outputs OUT1 and OUT2 which are pulse signals are connected to a first low-pass filter LF1, whereby the digital signals are converted into analog signals. Then, a first speaker S1 which is a load is operated by the analog signals. The signal before conversion by the low-pass filter LF1 is a pulse signal as shown in FIG. 4A, and the signal after conversion by the low-pass filter LF1 is an analog signal as shown in FIG. 4B. In other words, the present embodiment achieves pulse-width modulation (PWM) by means of performing D-class amplification.

Each of the third and fourth channels CH3 and CH4 constitutes a half bridge as similar to the above-described first channel CH1, and the channels CH3 and CH4 collectively constitute an H bridge. Specifically, third and fourth outputs OUT3 and OUT4 which are pulse signals are converted into analog signals by a second low-pass filter LF2. Then, a second speaker S2 is operated by the analog signals.

Figure 5A:
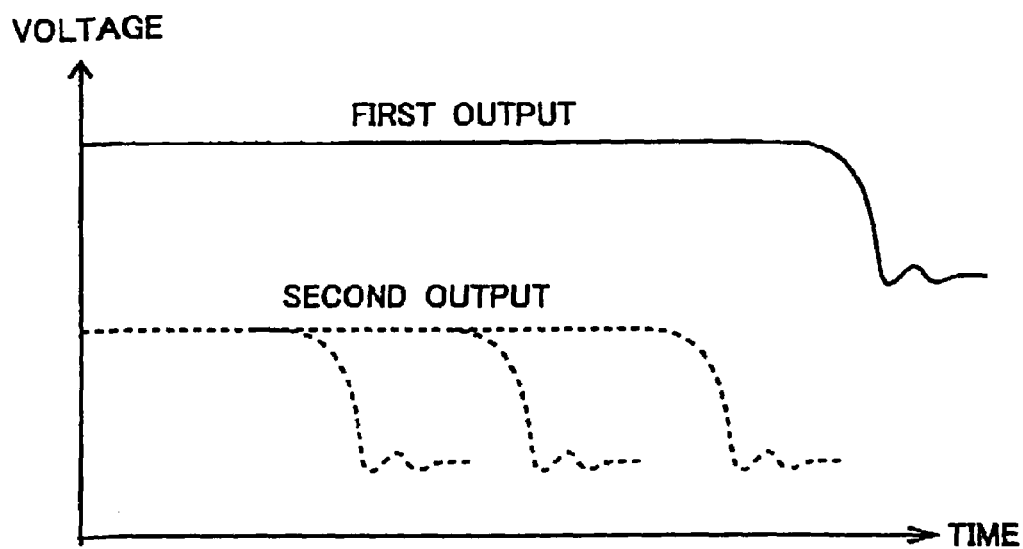
FIGS. 5A and 5B are graphs showing characteristics of the hybrid integrated circuit device of the present embodiment.
Figure 5B:
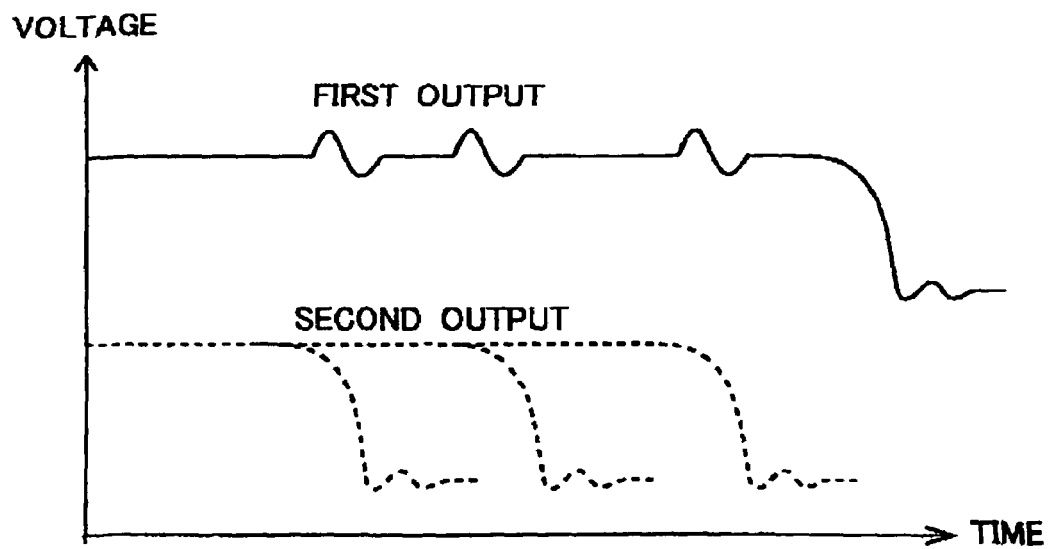
Figure 6A:
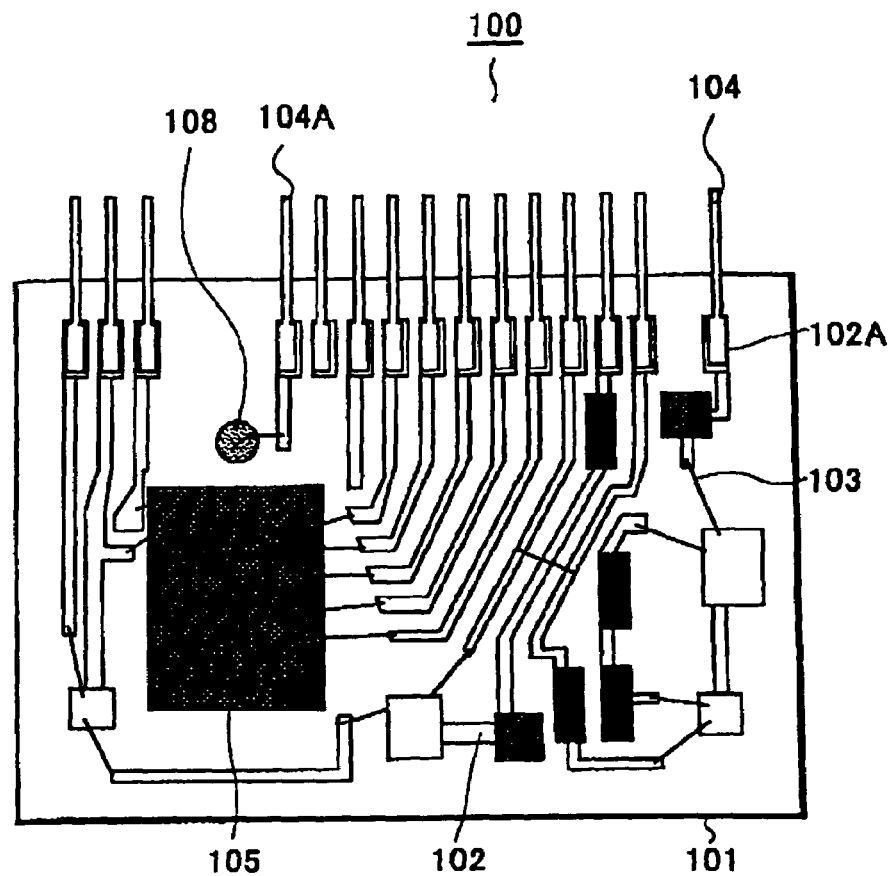
FIG. 6A is a plan view showing a conventional hybrid integrated circuit device.
Figure 6B:
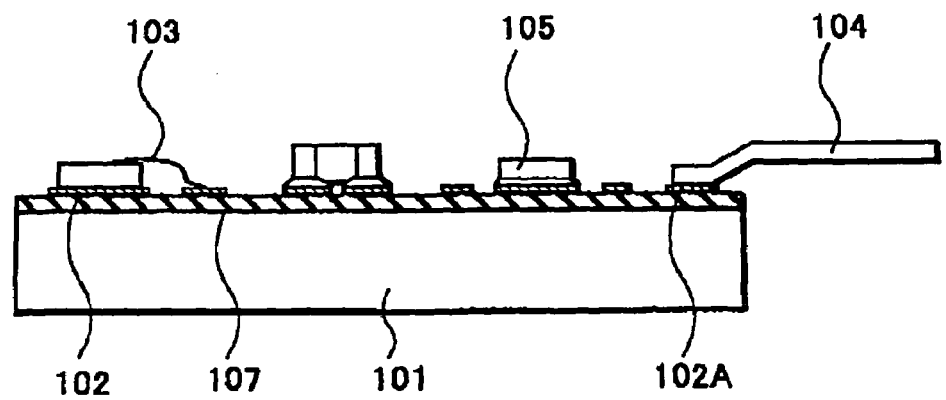
FIG. 6B is a cross-sectional view thereof.

A concrete effect attributable to the configuration of the hybrid integrated circuit device of the present embodiment will be described with reference to FIGS. 5A and 5B. FIG. 5A shows output waveforms of the hybrid integrated circuit device 10 of the present embodiment, and FIG. 5B shows output waveforms of the conventional hybrid integrated circuit device 100. In each of the drawings, a horizontal axis represents a time axis and a vertical axis represents magnitude of output voltages.

Figure 3:
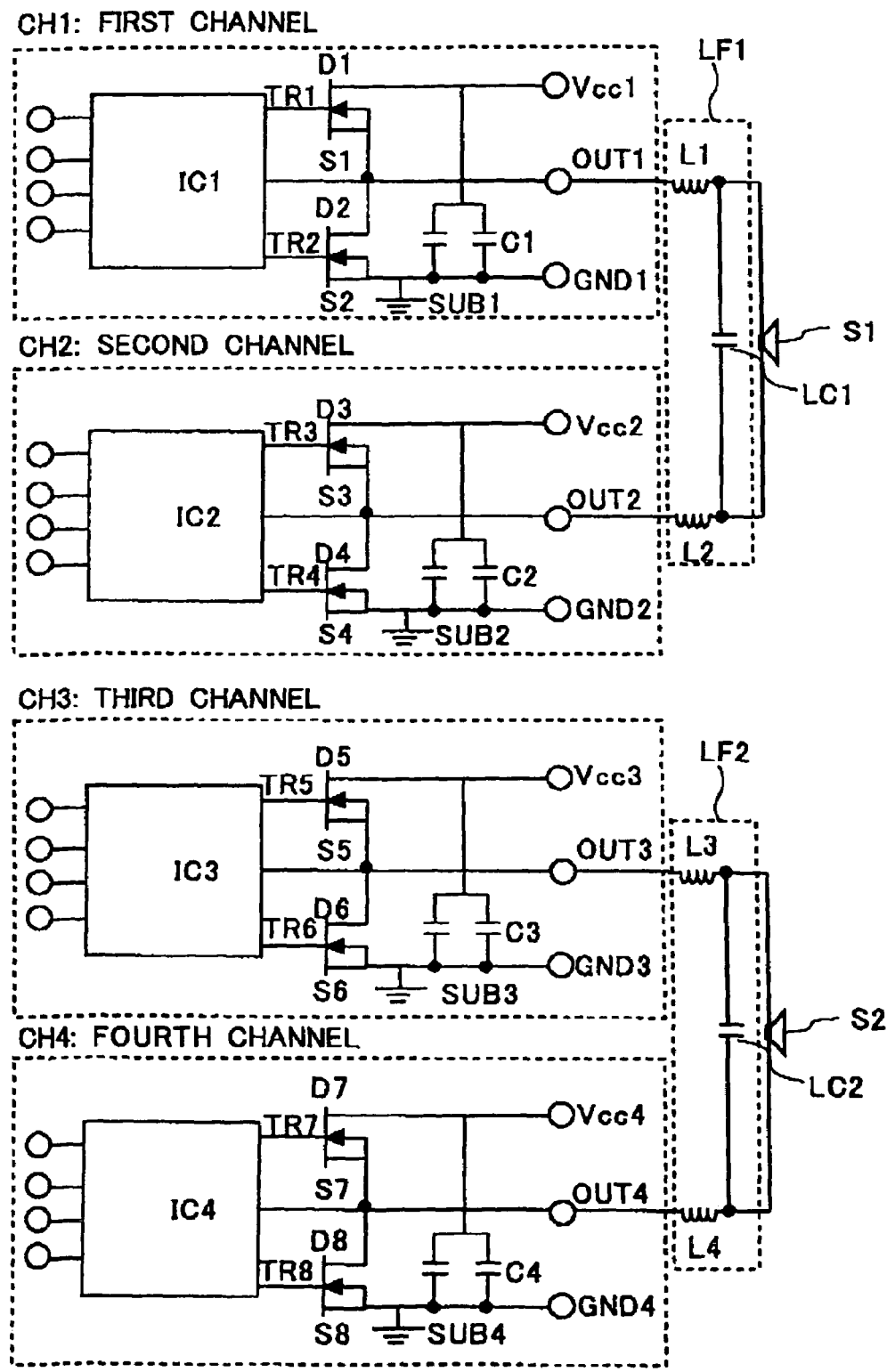
FIG. 3 is a circuit diagram of the hybrid integrated circuit device of the present embodiment.

Referring to FIG. 5A, a first output is the output of the first channel CH1 shown in FIG. 3, for example. Meanwhile, a second output is an output waveform of the second channel CH2 which is adjacent to the first channel CH1. As apparent from the drawing, if the second output is changed while the first output is flat, such a change has very little effect on the first output.

Referring to FIG. 5B, when a second output is changed while a first output is flat, a voltage value of the first output is changed. This is because electric potential of the metal substrate 101 is fluctuated by the change in the second output, and the first output is influenced by the change in the electric potential. Accordingly, when an audio amplifier function is incorporated in the hybrid integrated circuit device 100, noises occur in an audio signal which is an output.

Note that various modifications are possible to the above-described embodiment within the scope of the present embodiment. It is possible to implement the following modifications, for example.

Although the hybrid integrated circuit device 10 constitutes the audio amplifier module in the foregoing description, the hybrid integrated circuit device 10 may constitute an electric circuit for a different use. For example, the hybrid integrated circuit device 10 may constitute an inverter circuit, a DC/DC converter circuit, or the like.

Although the conductive pattern connected to the ground potential is connected to the metal substrate in the vicinity of the semiconductor element in the embodiment, it is also possible to provide a different contact portion point to connect the metal substrate to the ground potential instead. In this way, it is possible to further improve a shielding effect of the metal substrate.

The present embodiment can exert the following effects.

The conductive pattern connected to the ground potential is connected to the metal substrate in the vicinity of the semiconductor element which operates at high speed. Therefore, even if the electric potential of the metal substrate in the vicinity of the semiconductor element is changed by operation thereof, it is possible to discharge the electric potential outward through the conductive pattern. In this way, it is possible to suppress malfunction of the electric circuit and occurrence of noises.

Moreover, the decoupling capacitor is fixed to the metal substrate in the vicinity of the semiconductor element which operates at high speed so as to allow this capacitor to absorb the electric potential of the metal substrate. Accordingly, it is possible to suppress malfunction of the electric circuit and occurrence of noises more effectively.

What is claimed is:

1. A hybrid integrated circuit device comprising:
   a metal substrate provided with an insulating layer on a surface thereof;
   a conductive pattern formed on a surface of the insulating layer;
   a semiconductor element fixed onto the conductive pattern; and
   a contact portion for electrically connecting the conductive pattern to the metal substrate in the vicinity of the semiconductor element,
   wherein the conductive pattern electrically connected to the metal substrate is connected to ground potential.

2. The device of claim 1, wherein a surface of the metal substrate exposed by partially removing the insulating layer is electrically connected to the conductive pattern through a fine metal wire at the contact portion.

3. The device of claim 1, wherein the conductive pattern and the semiconductor element constitute a D-class amplifier circuit.

4. The device of claim 1, further comprising:
a capacitor for short-circuiting a portion of the conductive pattern connected to the ground potential and a portion of the conductive pattern connected to a power source in the vicinity of the contact portion.

5. A hybrid integrated circuit device comprising:
a metal substrate provided with an insulating layer on a surface thereof;
a conductive pattern formed on a surface of the insulating layer;
a semiconductor element being fixed onto the conductive pattern and constituting a bridge circuit; and
a contact portion for electrically connecting the metal substrate in the vicinity of the semiconductor element to the conductive pattern connected to ground potential.

6. The device of claim 5,
wherein the surface of the metal substrate exposed by partially removing the insulating layer is electrically connected to the conductive pattern through a fine metal wire at the contact portion.

7. The device of claim 5, further comprising:
a capacitor for short-circuiting a portion of the conductive pattern connected to the ground potential and a portion of the conductive pattern connected to a power source in the vicinity of the contact portion.

8. The device of claim 5,
wherein the a plurality of bridge circuits are provided, and the contact portion is provided to each of the bridge circuits.

* * * * *